United States Patent
Chopra (12)

(10) Patent No.: US 6,703,309 B1
(45) Date of Patent: Mar. 9, 2004

(54) METHOD OF REDUCING OXIDATION OF METAL STRUCTURES USING ION IMPLANTATION, AND DEVICE FORMED BY SUCH METHOD

(75) Inventor: Dinesh Chopra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/229,457

(22) Filed: Aug. 28, 2002

(51) Int. Cl.⁷ .............................................. H01L 21/44
(52) U.S. Cl. ..................... 438/659; 438/627; 438/643; 438/687
(58) Field of Search ................. 438/658, 659, 438/687, 627, 643, 653

(56) References Cited

U.S. PATENT DOCUMENTS

| | | | | |
|---|---|---|---|---|
| 6,046,108 A | * | 4/2000 | Liu et al. | 438/687 |
| 6,117,770 A | * | 9/2000 | Pramanick et al. | 438/659 |
| 6,268,291 B1 | * | 7/2001 | Andricacos et al. | 438/694 |
| 6,281,127 B1 | * | 8/2001 | Shue | 438/691 |
| 6,426,289 B1 | * | 7/2002 | Farrar | 438/670 |
| 6,500,749 B1 | * | 12/2002 | Liu et al. | 438/618 |

FOREIGN PATENT DOCUMENTS

JP          10041298 A  *  2/1998  ....... H01L/21/3205

OTHER PUBLICATIONS

Shibata et al., "Lithography-less Ion Implantation Technology for Agile Fab," ULVAC Confidential.
Shibata et al., "Stencil Mask Ion Implantation Technology for High Performance MOSFETs," 2000 IEEE.

* cited by examiner

Primary Examiner—Amir Zarabian
Assistant Examiner—Jamie L. Brophy
(74) Attorney, Agent, or Firm—Williams, Morgan & Amerson, P.C.

(57) ABSTRACT

The present invention is generally directed to a method of reducing oxidation of metal structures using ion implantation, and a device constructed in accordance with the method. In one illustrative embodiment, the method comprises providing a semiconducting substrate having a first layer of insulating material formed thereabove, the first layer of insulating material having at least one conductive structure positioned therein, and performing an ion implant process to implant ions into at least the one conductive structure.

26 Claims, 5 Drawing Sheets

METHOD OF REDUCING OXIDATION OF METAL STRUCTURES USING ION IMPLANTATION, AND DEVICE FORMED BY SUCH METHOD

BACKGROUND OF THE INVENTION

1. Field of the Invention

This present invention is generally directed to the field of semiconductor processing, and, more particularly, to a method of reducing oxidation of metal structures using ion implantation, and a device formed by performing such a method.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., memory cells, transistors, etc. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical semiconductor device to increase the overall speed of the device, as well as that of integrated circuit devices incorporating such semiconductor devices.

In modem integrated circuits, millions of very small semiconductor devices, e.g., transistors, memory cells, resistors, capacitors, etc., are formed above a semiconducting substrate, such as silicon. To produce a working integrated circuit, all of these various semiconductor devices must be electrically coupled together. This is typically accomplished by a complex arrangement of conductive wiring, e.g., conductive lines and conductive plugs, that are formed in multiple layers of insulating material formed above the substrate. Historically, such conductive wiring patterns have been made from a variety of materials, such as aluminum.

However, as device dimensions continue to shrink, and as the desire for greater performance, e.g., faster operating speeds, has increased, copper has become more popular as the material for the conductive interconnections, i.e., conductive lines and vias, in modern integrated circuit devices. This is due primarily to the higher electrical conductivity of copper as compared to the electrical conductivity of other materials used for such wiring patterns, e.g., aluminum.

Typically, the copper wiring patterns may be formed by performing known single or dual damascene processing techniques. Normally, the conductive lines and plugs for an integrated circuit device are formed in multiple layers of insulating material formed above the substrate. For example, a modern complex integrated circuit device may have four or more levels of these conductive lines and plugs that are connected together such that the circuit may function in its intended manner.

FIGS. 1A–1B depict one illustrative example of an illustrative prior art technique for forming such conductive lines and plugs in a layer of insulating material. As shown in FIG. 1A, a plurality of conductive metal structures 12 are positioned in a first layer of insulating material 10. The first layer of insulating material 10 is intended to be representative in nature in that it may be formed at any location above a semiconducting substrate. The first layer of insulating material 10 may be comprised of a variety of materials, such as silicon dioxide, boron phosphosilicate glass (BPSG), a so-called low-k dielectric, etc. The conductive metal structure 12 may be comprised of a variety of materials, such as copper. In the case where the conductive metal structures 12 are comprised of copper, they may be formed in the first insulating layer 10 using known single or dual damascene techniques.

Thereafter, a diffusion barrier layer 14 is deposited above the first insulating layer 10 and the conductive metal structures 12. The diffusion barrier layer 14 may be comprised of a variety of materials, such as silicon carbide (SiC) or silicon nitride (SiN). As shown in FIG. 1B, a second layer of insulating material 16 is then formed above the diffusion barrier layer 14. The second layer of insulating material 16 may be comprised of the same materials as that of the first layer of insulating material 10. Next, a plurality of openings 18 are formed in the second layer of insulating material 16 and the diffusion barrier layer 14 using one or more known etching processes. A plurality of conductive metal structures 12 are then formed in the openings 18. This process is continued until such time as all of the desired levels of wiring are completed.

The diffusion barrier layer 14 is provided to reduce or prevent oxidation of the upper surface 13 of the conductive metal structures 12 positioned in the first layer of insulating material 10 during the subsequent formation of the second layer of insulating material 16. That is, the second layer of insulating material 16 is normally formed in an oxygen environment at a temperature in excess of 150–200° C. If the diffusion barrier layer 14 were not present, the upper surface 13 of the conductive metal structures 12 would oxidize to some degree. Such oxidation would be undesirable for a variety of reasons, e.g., it would increase the resistance of the conductive metal structure 12. However, the use of the diffusion barrier layer 14 to address this problem effectively increases the dielectric constant of the insulating materials positioned around the conductive metal structures 12. That is, a typical diffusion barrier layer 14 may be comprised of a material having a dielectric constant that ranges from approximately 4–8. As a result of the use of the diffusion barrier layer 14, the overall capacitance of the device may be increased thereby tending to produce a slower operating device.

The present invention is directed to a method that may solve, or at least reduce, some or all of the aforementioned problems.

SUMMARY OF THE INVENTION

The present invention is generally directed to various methods of reducing oxidation of metal structures using ion implantation, and an integrated circuit device formed by such methods. In one illustrative embodiment, the method comprises providing a semiconducting substrate having a first layer of insulating material formed thereabove, the first layer of insulating material having at least one conductive structure positioned therein, and performing an ion implant process to implant ions into at least one conductive structure. In other embodiments, the method further comprises forming a second layer of insulating material above the first layer of insulating material and at least one conductive structure. In even further embodiments, ions are selectively implanted only into the conductive metal structure. In an additional embodiment, the ions are implanted into both the first layer of insulating material and into the conductive metal structure.

In one illustrative embodiment, the integrated circuit device comprises a first layer of insulating material positioned above a semiconducting substrate and at least one conductive metal structure positioned in the first layer of insulating material, wherein the conductive metal structure has a doped region formed therein adjacent a first surface of the conductive metal structure. In a further embodiment, a second layer of insulating material is positioned above the first layer of insulating material and the conductive metal structure.

BRIEF DESCRIPTION OF THE DRAWINGS

The invention may be understood by reference to the following description taken in conjunction with the accompanying drawings, in which like reference numerals identify like elements, and in which.

Figure 1A:
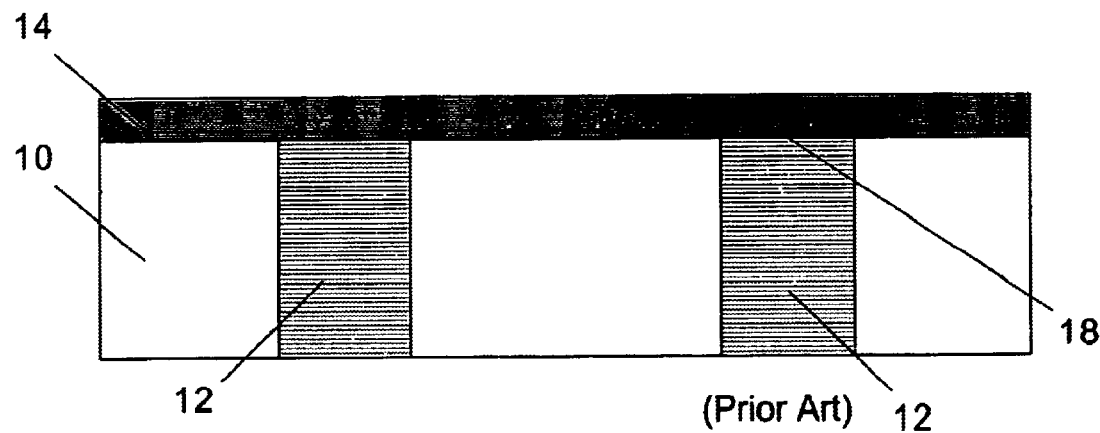
FIGS. 1A–1B depict an illustrative prior art process flow for forming conductive interconnections comprised of copper.
Figure 1B:
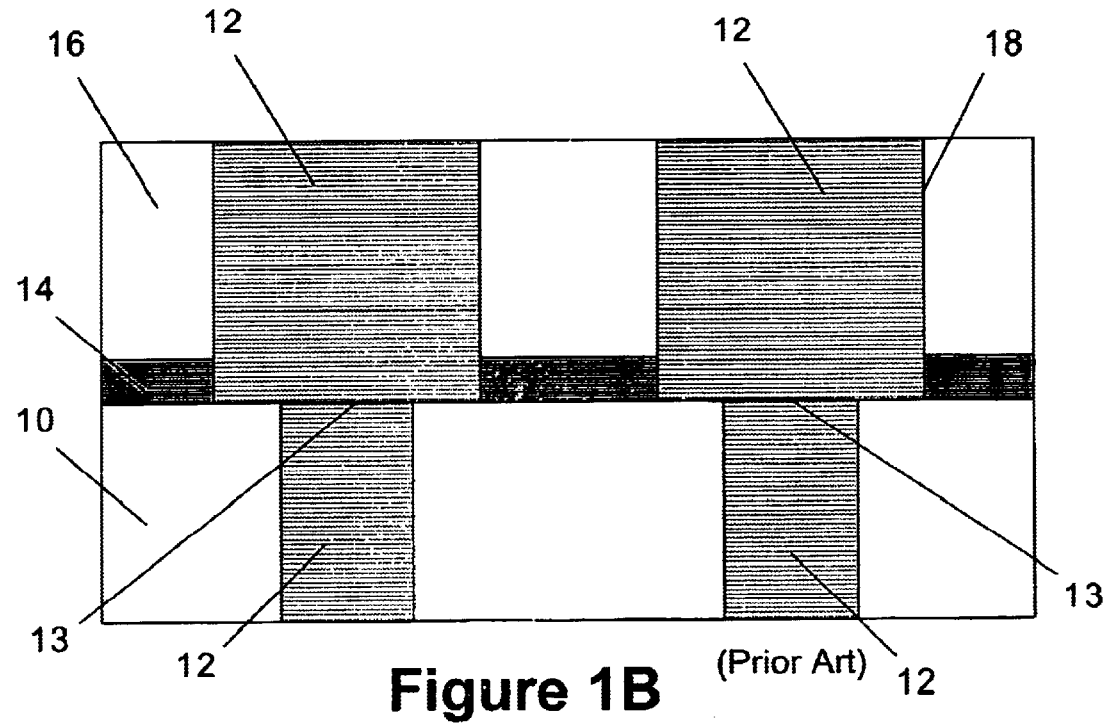

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
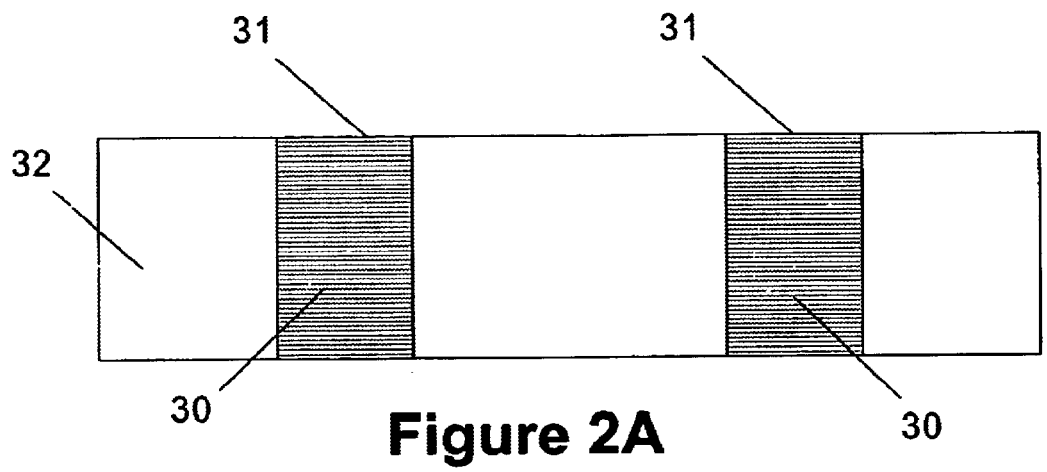
FIGS. 2A–2E depict various aspects of one illustrative process flow in accordance with one embodiment of the present invention.

As shown in FIG. 2A, a plurality of conductive metal structures 30 are formed in a first insulating layer 32. The first insulating layer 32 is intended to be representative in nature in that it may be formed at any level above a semiconducting substrate. The first layer of insulating material 32 may be comprised of a variety of materials, such as silicon dioxide, BPSG, etc., and its thickness may vary depending upon the particular application. The first layer of insulating material 32 may be formed by a variety of techniques, e.g., chemical vapor deposition (CVD), plasma enhanced chemical vapor deposition (PECVD), etc.

The conductive metal structures 30 may be comprised of any of a variety of materials, such as copper. The conductive metal structures 30 may be conductive metal lines or conductive plugs that are part of the overall wiring pattern of an integrated circuit device. The size and configuration of the conductive metal structures 30 may also vary. The conductive metal structures 30 may be formed using a variety of known process flows. For example, in the case where the conductive metal structures 30 are comprised of copper, such structures may be formed using known single or dual damascene techniques. For other types of metals, a layer of metal (not shown) may be initially formed and then patterned by performing one or more known etching processes. Thereafter, the layer of insulating material 32 may be formed in and around the patterned layer of metal.

Figure 2B:
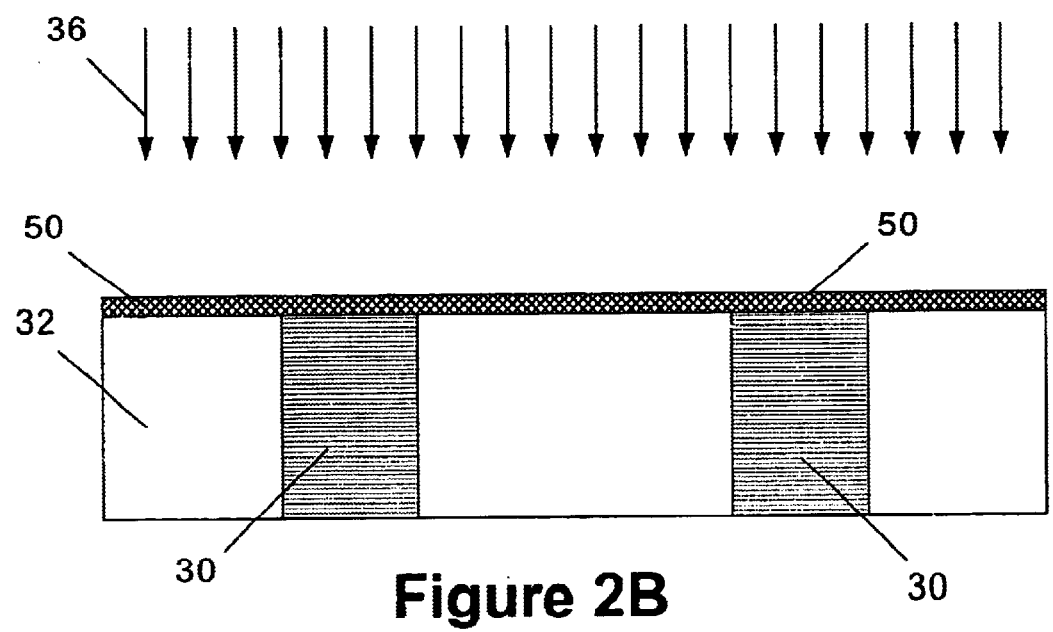
Figure 2C:
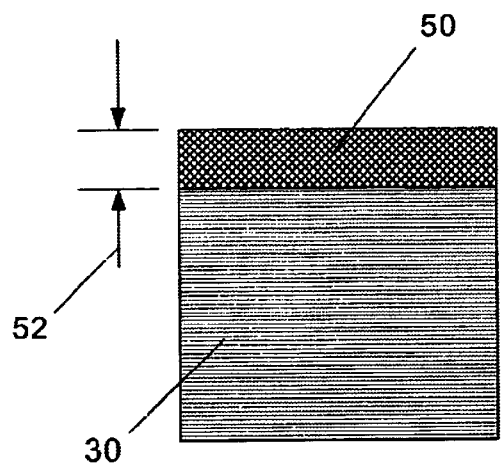
Figure 2D:
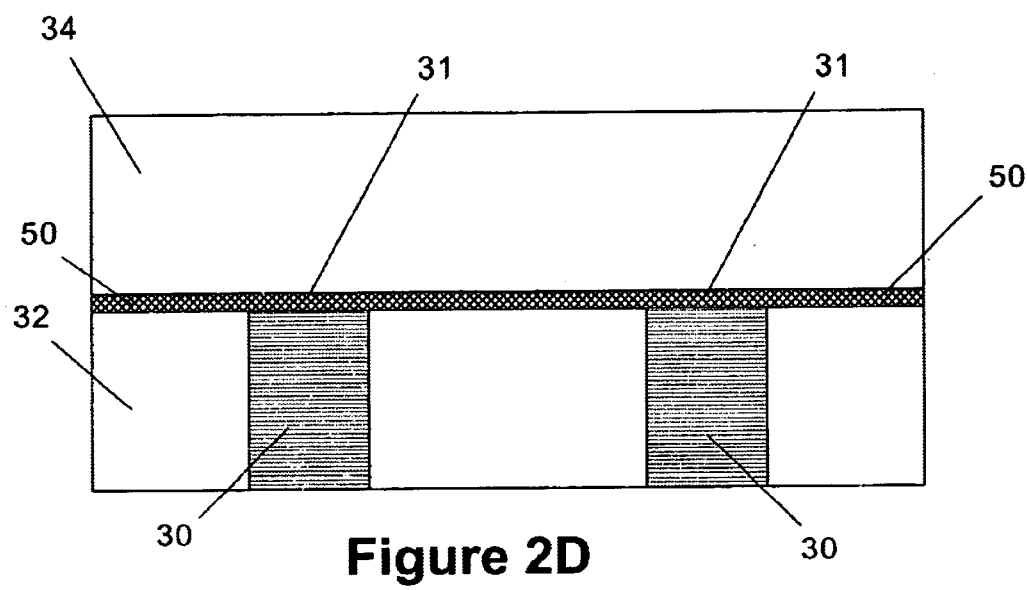

Next, as shown in FIG. 2B, an ion implantation process is performed, as indicated by the arrows 36, to implant nitrogen, carbon, silicon or hydrogen into the first layer of insulating material 32 and conductive metal structures 30. This results in an implant region 50. FIG. 2C is an enlarged view of an illustrative conductive member 30 with the implant region 50 formed therein. The implant region 50 has a depth 52 that may range from approximately 5–50 nm in the exemplary embodiment. The depth 52 of the implant region 50 in the first layer of insulating material 32 may be different than the depth 52 of the implant region 50 in the conductive metal structure 30. In one illustrative embodiment, the implanted ions may be comprised of nitrogen, silicon, carbon or hydrogen. The ions may be implanted at a dopant dosage of approximately $1e^{13}$–$1e^{21}$ ions/cm$^2$ and at an energy level of approximately 1–200 keV. The resulting doped region 50 may have a dopant concentration that ranges from approximately $1e^{15}$–$1e^{21}$ ions/cm$^3$.

Figure 2E:
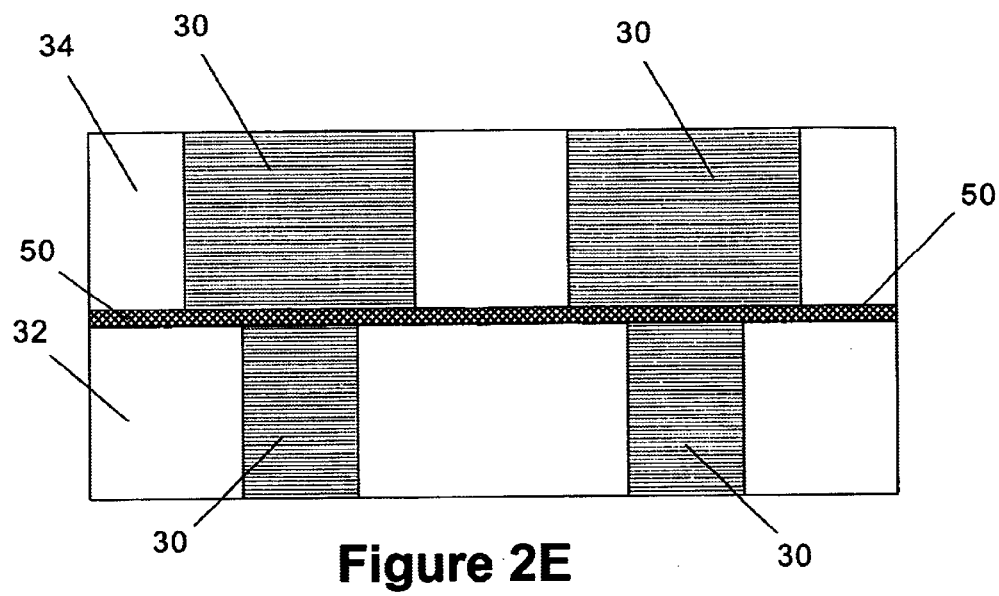

After the implantation process 36 is performed, a second layer of insulating material 34 is formed above the first layer of insulating material 32 and the conductive metal structures 30. The second layer of insulating material 34 may be comprised of materials similar to those described for the first layer of insulating material 32. Due to the presence of the implant regions 50 in the conductive metal structures 30, a separate diffusion barrier layer is not required to reduce or prevent oxidation of the surface 31 (see FIG. 2A) of the conductive metal structures 30. That is, the implant regions 50 act to effectively fill or stuff the grain boundaries of the conductive metal structures 30, thereby preventing or reducing oxidation of the conductive metal structures 30 during the process used to form the second layer of insulating material 34. As shown in FIG. 2E, a plurality of conductive metal structures 30 are then formed in the second insulating layer 34 using a variety of known techniques. This process is repeated until such time as all of the desired wiring levels have been formed.

Figure 3A:
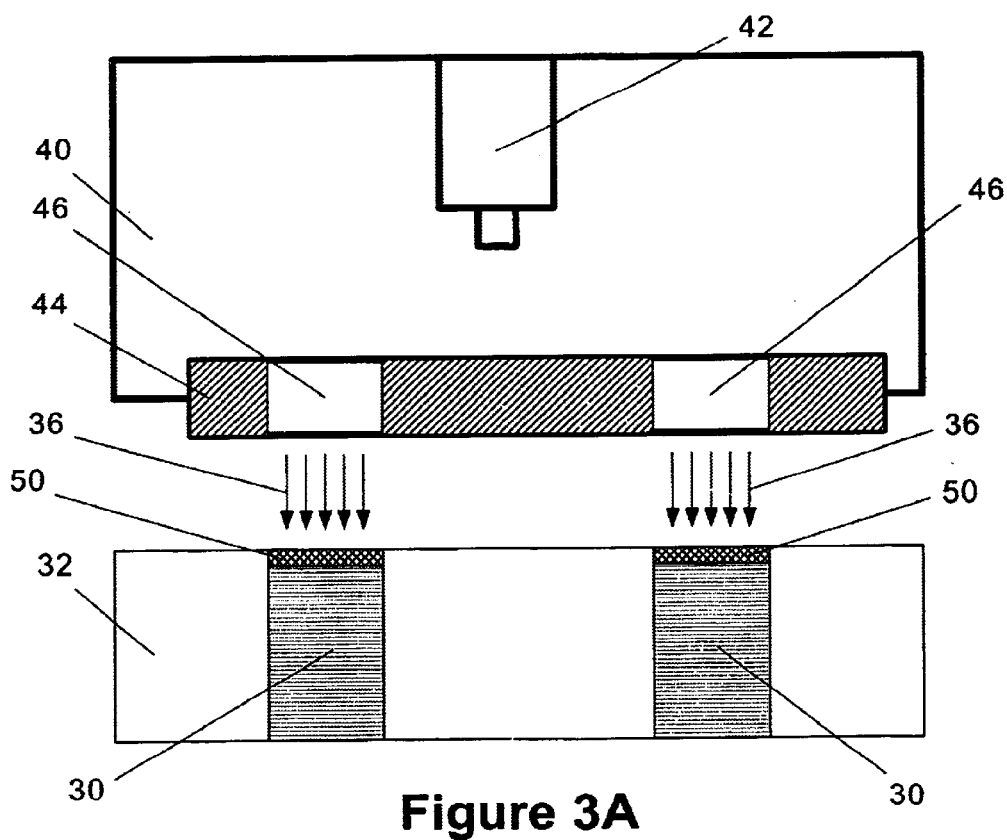
FIGS. 3A–3B depict another illustrative process flow in accordance with another embodiment of the present invention.
Figure 3B:
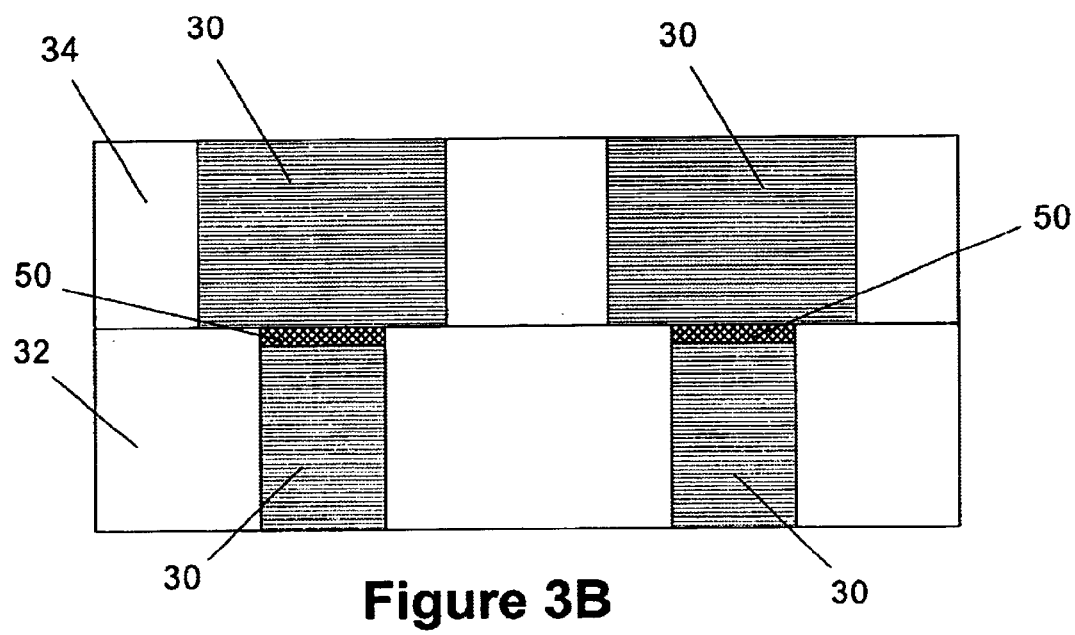

FIGS. 3A–3B depict another illustrative embodiment of the present invention wherein the desired dopant atoms are selectively implanted into the conductive metal structures 30. The selective doping of the conductive metal structures 30 may be accomplished by using a stencil mask lithographic ion implant (SLIM) tool developed by ULVAC of Japan. Aspects of this tool are disclosed in papers entitled "Lithography-less Ion Implantation Technology for Agile Fab," Shibata et al., and "Stencil Mask Ion Implantation Technology for High Performance MOSFETs," Shibata et al. Both of these articles are hereby incorporated by reference in their entirety. A schematic depiction of such a stencil mask implant tool 40 is shown in FIG. 3A. In general, the stencil mask implant tool 40 is comprised of an ion beam generator 42 (ion source) for implanting ions and a mask or reticle 44, having a plurality of openings 46 formed therein. In operation, ions will be generated by the ion beam generator 42, and the mask 44 will be used to insure that dopant atoms (as indicated by the arrows 36) are only implanted at the desired locations. The stencil mask implant tool 40 may be stepped across the wafer in a step and expose technique similar to that employed in traditional stepper equipment used in photolithography processing. The implant process is continued until all desired areas of the conductive metal structures 30 are implanted with the desired dopant material. This process results in the formation of the doped regions 50 only in the conductive metal structures 30.

Thereafter, as shown in FIG. 3B, the second layer of insulating material 34 is formed above the first layer of insulating material 32 and the conductive metal structures 30 positioned therein. Then, a plurality of conductive metal structures 30 are formed in the second layer of insulating material 34. As before, the presence of the doped regions 50 reduces or prevents the oxidation of the metal structures 30 positioned in the first layer of insulating material 32. The various implant processes described herein may be accomplished by use of the above-referenced stencil mask implant tool developed by ULVAC, or they may be performed using traditional photolithography and ion implant tools and techniques.

The present invention is generally directed to a method of reducing oxidation of metal structures using ion implantation, and a system for performing same. In one illustrative embodiment, the method comprises providing a semiconducting substrate having a first layer of insulating material formed thereabove, the first layer of insulating material having at least one conductive structure positioned therein, and performing an ion implant process to implant ions into at least one conductive structure. In further embodiments, the method comprises forming a second layer of insulating material above the first layer of insulating material and at least one conductive structure. In other embodiments of the present invention, the ions are implanted into the conductive metal structures and into the layer of insulating material positioned around the metal structures. In even further embodiments, the ions are selectively implanted into only the conductive metal structures.

In one illustrative embodiment, the integrated circuit device comprises a first layer of insulating material positioned above a semiconducting substrate and at least one conductive metal structure positioned in the first layer of insulating material, wherein the conductive metal structure has a doped region formed therein adjacent a first surface of the conductive metal structure. In further embodiments, the device further comprises a second layer of insulating material positioned above the first layer of insulating material and the conductive metal structure.

The present invention is also directed to a system that may be used to perform one or more of the methods described herein. In one illustrative embodiment, the system is comprised of a stencil mask ion implant tool that is adapted to selectively implant ions only into one or more conductive metal structures formed in a layer of insulating material. In other embodiments, an implant tool may be used to implant ions into both a layer of insulating materials and into one or more conductive metal structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

providing a semiconducting substrate having a first layer of insulating material formed thereabove, said first layer of insulating material having at least one conductive copper structure positioned therein; and performing an ion implant process to implant ions into said at least one conductive copper structure and into said first layer of insulating material to thereby form a doped region in at least said conductive copper structure, wherein said doped region has a thickness that ranges from approximately 5–50 nm and a dopant concentration level that ranges from approximately $1e^{15}$–$1e^{21}$ ions/cm$^3$.

2. The method of claim 1, further comprising forming a second layer of insulating material above said first layer of insulating material and said at least one conductive copper structure.

3. The method of claim 1, wherein said first layer of insulating material is comprised of at least one of silicon dioxide and BPSG.

4. The method of claim 1, wherein performing said ion implant process comprises performing said ion implant process using at least one of nitrogen, carbon, silicon and hydrogen.

5. The method of claim 1, wherein performing said ion implant process comprises performing said ion implant process at a dopant dose that ranges from approximately $1e^{13}$–$1e^{21}$ ions/cm$^2$.

6. The method of claim 1, wherein performing said ion implant process comprises performing said ion implant process at an energy level ranging from approximately 1–200 keV.

7. The method of claim 1, further comprising forming a second conductive metal structure above said doped region in said at least one conductive copper structure.

8. A method, comprising:

providing a semiconducting substrate having a first layer of insulating material formed thereabove, said first layer of insulating material having at least one conductive copper structure positioned therein; and performing an ion implant process to implant ions into at least said at least one conductive copper structure to thereby form a doped region having a thickness that ranges from approximately 5–50 nm in at least said at least one conductive copper structure, said doped region being comprised of at least one of said implant ions, said implant ions comprised of at least one of hydrogen, carbon, silicon and nitrogen.

9. The method of claim 8, further comprising forming a second layer of insulating material above said first layer of insulating material and said at least one conductive copper structure.

10. The method of claim 8, wherein said first layer of insulating material is comprised of at least one of silicon dioxide and BPSG.

11. The method of claim 8, wherein performing the ion implant process to implant ions into at least said at least one conductive copper structure comprises performing the ion implant process to implant ions into said first layer of insulating material and into said at least one conductive copper structure.

12. The method of claim 8, wherein performing said ion implant process comprises performing said ion implant process at a dopant dose that ranges from approximately $1e^{13}$–$1e^{21}$ ions/cm$^2$.

13. The method of claim 8, wherein performing said ion implant process comprises performing said ion implant process at an energy level ranging from approximately 1–200 keV.

14. The method of claim 8, wherein said doped region has a dopant concentration level that ranges from approximately $1e^{15}$–$1e^{21}$ ions/cm$^3$.

15. The method of claim 8, further comprising forming a second conductive copper structure above said doped region in said at least one conductive copper structure.

16. A method, comprising:

providing a semiconducting substrate having a first layer of insulating material formed thereabove, said first layer of insulating material having at least one conductive metal structure positioned therein;

performing an ion implant process to implant ions into said at least one conductive metal structure and into said first layer of insulating material; and forming a second layer of insulating material above said first layer of insulating material and said at least one conductive metal structure.

17. The method of claim 16, wherein said first layer of insulating material is comprised of at least one of silicon dioxide and BPSG.

18. The method of claim 16, wherein said at least one conductive metal structure is comprised of copper.

19. The method of claim 16, wherein performing said ion implant process comprises performing said ion implant process using at least one of nitrogen, carbon, silicon and hydrogen.

20. The method of claim 16, wherein performing said ion implant process comprises performing said ion implant process at a dopant dose that ranges from approximately $1e^{13}$–$1e^{21}$ ions/cm$^2$.

21. The method of claim 16, wherein performing said ion implant process comprises performing said ion implant process at an energy level ranging from approximately 1–200 keV.

22. The method of claim 16, wherein performing the ion implant process to implant ions into said at least one conductive metal structure and into said first layer of insulating material comprises performing the ion implant process to implant ions into said at least one conductive metal structure and into said first layer of insulating material to thereby form a doped region in said at least one conductive metal structure and in said first layer of insulating material.

23. The method of claim 22, wherein said doped region has a thickness that ranges from approximately 5–50 nm.

24. The method of claim 22, wherein said doped region has a dopant concentration level that ranges from approximately $1e^{15}$–$1e^{21}$ ions/cm$^3$.

25. A method, comprising:

providing a semiconducting substrate having a first layer of insulating material formed thereabove, said first layer of insulating material having at least one conductive metal structure positioned therein; and performing an ion implant process to implant ions into said at least one conductive metal structure and into said first layer of insulating material to thereby form a doped region having a thickness that ranges from approximately 5–50 nm in said at least one conductive metal structure and in said first layer of insulating material.

26. A method, comprising:

providing a semiconducting substrate having a first layer of insulating material formed thereabove, said first layer of insulating material having at least one conductive structure positioned therein; and performing an ion implant process to implant ions into said at least one conductive metal structure and into said first layer of insulating material to thereby form a doped region having a dopant concentration level that ranges from approximately $1e^{15}$–$1e^{21}$ ions/cm$^3$ in said at least one conductive metal structure and in said first layer of insulating material.

* * * * *